(12) United States Patent
Voldman

(10) Patent No.: US 8,178,925 B2
(45) Date of Patent: May 15, 2012

(54) SEMICONDUCTOR DIODE STRUCTURE OPERATION METHOD

(75) Inventor: Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 12/765,950

(22) Filed: Apr. 23, 2010

(65) Prior Publication Data

US 2010/0202091 A1 Aug. 12, 2010

Related U.S. Application Data

(62) Division of application No. 11/778,439, filed on Jul. 16, 2007, now Pat. No. 7,709,924.

(51) Int. Cl.
*H01L 29/861* (2006.01)

(52) U.S. Cl. .......................................... 257/355; 326/81

(58) Field of Classification Search .................. 257/357, 257/355, 409, 487, 490, 603; 326/81
See application file for complete search history.

(56) References Cited

U.S. PATENT DOCUMENTS

| | | | |
|---|---|---|---|
| 4,485,550 A | 12/1984 | Koeneke et al. | |
| 5,468,984 A | 11/1995 | Efland et al. | |
| 5,578,860 A | 11/1996 | Costa et al. | |
| 6,064,249 A | 5/2000 | Duvvury et al. | |
| 6,614,077 B2 * | 9/2003 | Nakamura et al. | 257/355 |
| 6,770,938 B1 | 8/2004 | Fliesler et al. | |
| 7,027,277 B1 | 4/2006 | Vashchenko et al. | |
| 7,285,828 B2 * | 10/2007 | Salcedo et al. | 257/357 |
| 2005/0041346 A1 | 2/2005 | Wu et al. | |
| 2005/0121725 A1 * | 6/2005 | Ando et al. | 257/356 |
| 2005/0213274 A1 | 9/2005 | Wu et al. | |
| 2006/0237794 A1 | 10/2006 | Husher | |
| 2008/0023767 A1 * | 1/2008 | Voldman | 257/355 |

FOREIGN PATENT DOCUMENTS

JP 2000323666 A 11/2000

OTHER PUBLICATIONS

Notice of Allowance (Mail Date Dec. 16, 2009) for U.S. Appl. No. 11/778,439, filed Jul. 16, 2007.

* cited by examiner

*Primary Examiner* — Zandra Smith
*Assistant Examiner* — Mark Tornow
(74) *Attorney, Agent, or Firm* — Schmeiser, Olsen & Watts

(57) ABSTRACT

A semiconductor structure operation method. The method includes providing a semiconductor structure. The semiconductor structure includes first, second, third, and fourth doped semiconductor regions. The second doped semiconductor region is in direct physical contact with the first and third doped semiconductor regions. The fourth doped semiconductor region is in direct physical contact with the third doped semiconductor region. The first and second doped semiconductor regions are doped with a first doping polarity. The third and fourth doped semiconductor regions are doped with a second doping polarity. The method further includes (i) electrically coupling the first and fourth doped semiconductor regions to a first node and a second node of the semiconductor structure, respectively, and (ii) electrically charging the first and second nodes to first and second electric potentials, respectively. The first electric potential is different from the second electric potential.

4 Claims, 9 Drawing Sheets

SEMICONDUCTOR DIODE STRUCTURE OPERATION METHOD

This application is a divisional application claiming priority to Ser. No. 11/778,439, filed Jul. 16, 2007.

FIELD OF THE INVENTION

The present invention relates generally to semiconductor diode structures and more particularly to semiconductor diode structures for power technology.

BACKGROUND OF THE INVENTION

A conventional PN junction diode structure can be used for electrostatic discharge (ESD) protection. However, these prior art PN junction diode structures are designed for low voltage CMOS technology. Standard CMOS technology continues to scale, and cannot withstand high voltages. Power technologies integrate advanced CMOS technology (with application voltages between 1.8V and 5V), with circuitry in the 20 to 120V application range. Today, the continued scaling of CMOS technology provides a larger margin between these high voltage CMOS and low voltage CMOS. In the low voltage CMOS technology, the breakdown voltages of the CMOS junctions are less than 20V. Therefore, there is a need for a semiconductor diode structure (and a method for forming the same) which can withstand higher voltages than those of the prior art.

SUMMARY OF THE INVENTION

The present invention provides a semiconductor structure, comprising (a) a first doped semiconductor region, a second doped semiconductor region, a third doped semiconductor region, and a fourth doped semiconductor region, wherein the second doped semiconductor region is in direct physical contact with the first and third doped semiconductor regions, wherein the fourth doped semiconductor region is in direct physical contact with the third doped semiconductor region, wherein the first and second doped semiconductor regions are doped with a first doping polarity, wherein the third and fourth doped semiconductor regions are doped with a second doping polarity which is opposite to the first doping polarity, wherein a first dopant concentration of the first doped semiconductor region is higher than a second dopant concentration of the second doped semiconductor region, and wherein a fourth dopant concentration of the fourth doped semiconductor region is higher than a third dopant concentration of the third doped semiconductor region; and (b) a first node and a second node, wherein the first and second nodes are electrically coupled to the first and fourth doped semiconductor regions, respectively, wherein the first node is electrically charged to a first electric potential, wherein the second node is electrically charged to a second electric potential, and wherein the first electric potential is different from the second electric potential.

The present invention provides a semiconductor diode structure (and a method for forming the same) which can withstand higher voltages than those of the prior art.

DETAILED DESCRIPTION OF THE INVENTION

FIGS. 1A-1E show cross-section views used to illustrate a fabrication process of an ESD (electrostatic discharge) semiconductor structure 100, in accordance with embodiments of the present invention. More specifically, with reference to FIG. 1A, the fabrication process of the ESD semiconductor structure 100 starts with a P− substrate 110. The P− substrate 110 comprises silicon doped P−. The P− substrate 110 can be formed by ion implanting p-type dopants (e.g., boron atoms) into a semiconductor substrate 110 resulting in the P− substrate 110.

Figure 1A:
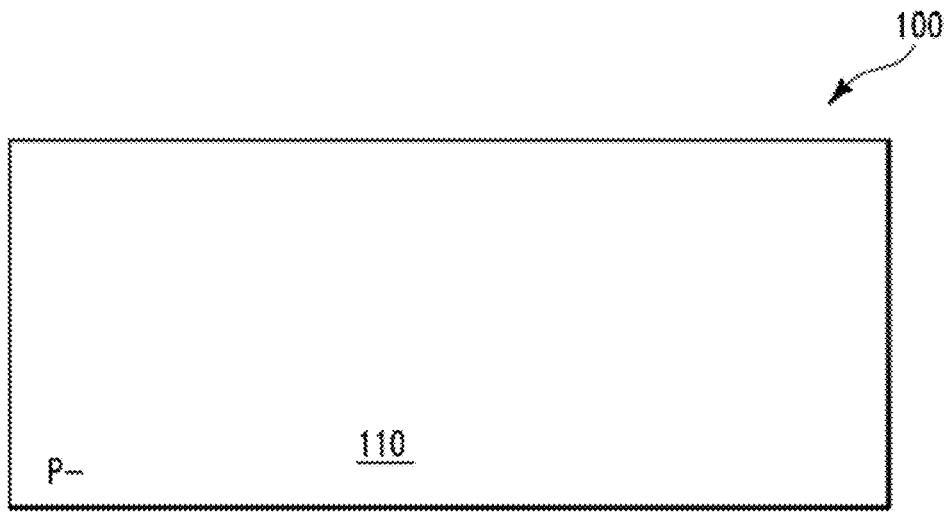
FIGS. 1A-1G show cross-section views used to illustrate a fabrication process of a first ESD (electrostatic discharge) semiconductor structure, in accordance with embodiments of the present invention.
Figure 1B:
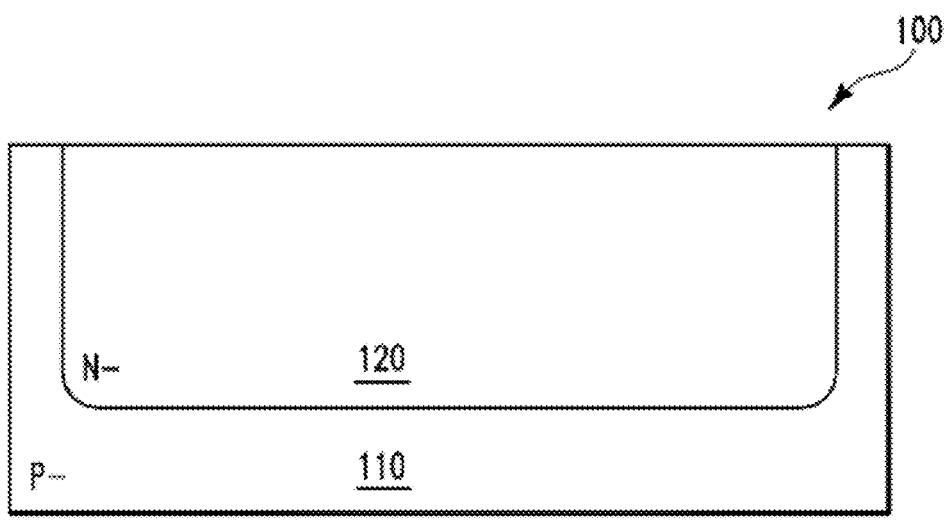

Next, with reference to FIG. 1B, in one embodiment, an N− tub region 120 is formed in the P− substrate 110. The N− tub region 120 comprises silicon doped N−. The N− tub region 120 can be formed by lithographic and ion implanting processes.

Figure 1C:
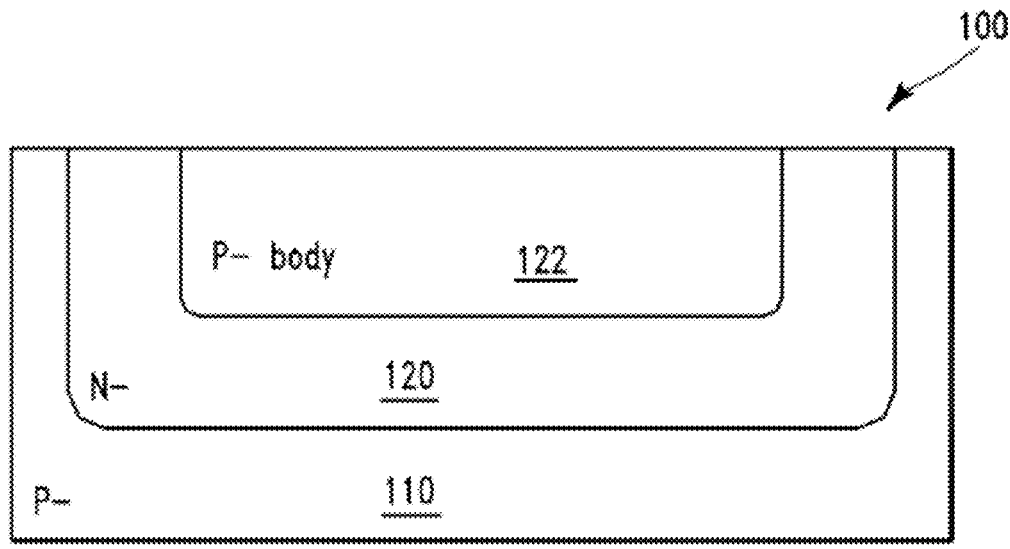

Next, with reference to FIG. 1C, in one embodiment, a P− body region 122 is formed in the N− tub region 120. The P− body region 122 comprises silicon doped P−. The P− body region 122 can be formed by lithographic and ion implanting processes. In one embodiment, the dopant concentrations of the P− body region 122 and the P− substrate 110 are in the range from $10^{15}$ to $10^{17}$ dopants/cm$^3$.

Figure 1D:
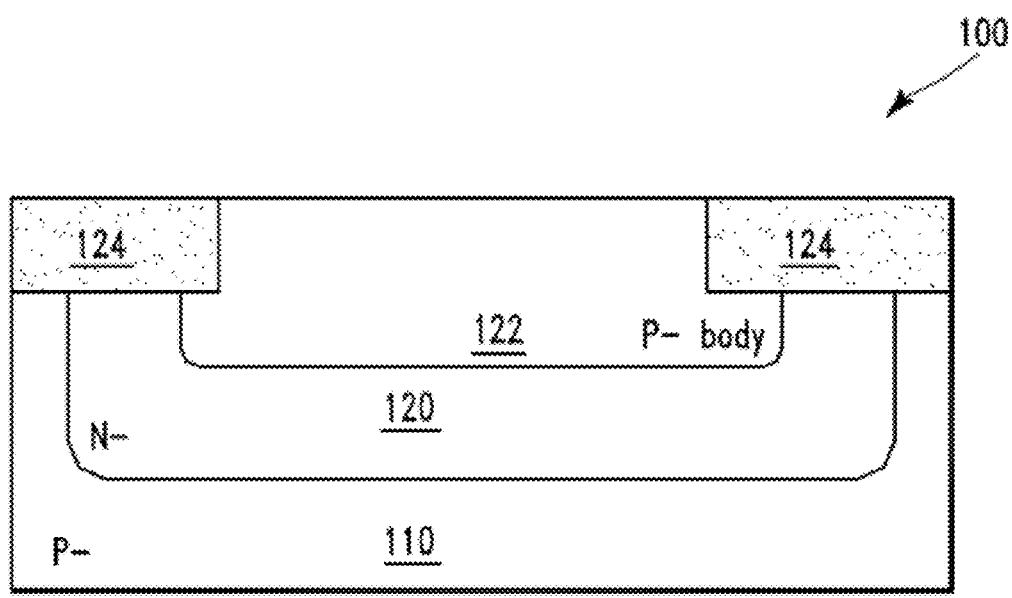

Next, with reference to FIG. 1D, in one embodiment, STI (shallow trench isolation) regions 124 are formed in the semiconductor structure 100. The STI regions 124 can comprise silicon dioxide. The STI regions 124 can be formed by a conventional method.

Figure 1E:
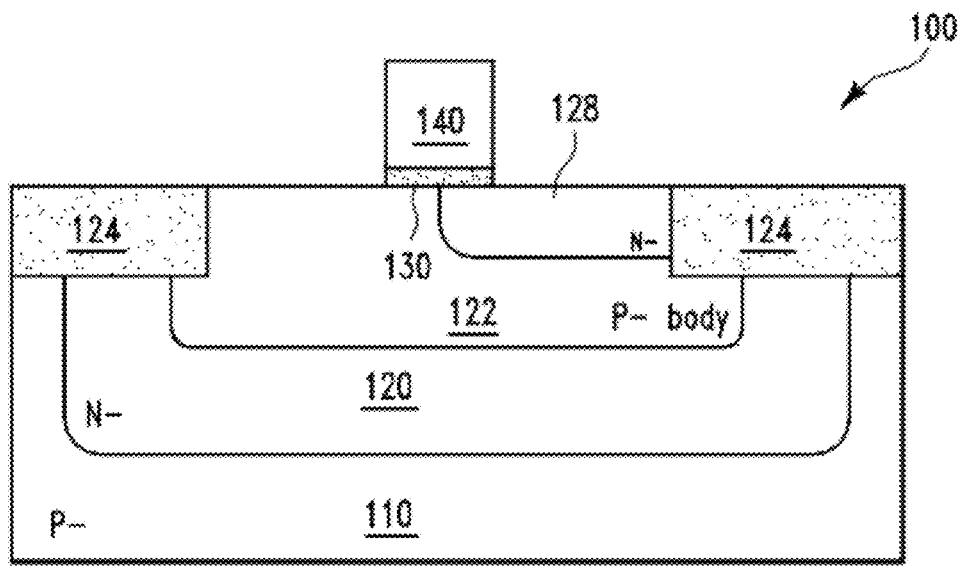

Next, with reference to FIG. 1E, in one embodiment, an N− region 128 is formed in the P− body region 122. The N− region 128 can comprise silicon doped with n-type dopants (e.g., arsenic atoms). The N− region 128 can be formed by lithographic and ion implanting processes.

Next, in one embodiment, a gate dielectric region 130 and a gate electrode region 140 are formed on top of the P− body region 122. The gate dielectric region 130 can comprise silicon dioxide. The gate electrode region 140 can comprise poly-silicon. The gate dielectric region 130 and the gate electrode region 140 can be formed by a conventional method.

Figure 1F:
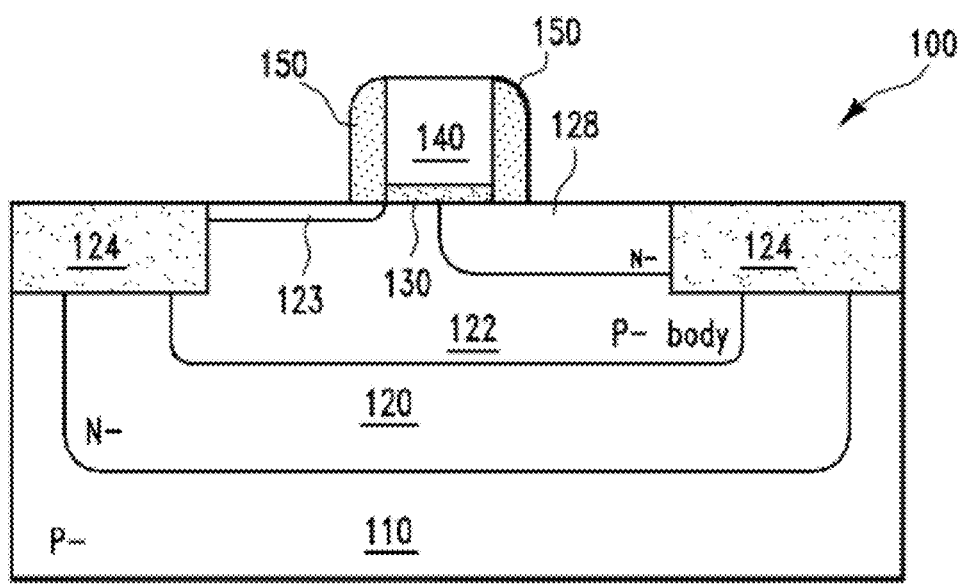

Next, with reference to FIG. 1F, in one embodiment, an extension region 123 is formed in the P− body region 122. The extension region 123 can comprise silicon doped with n-type dopants (e.g., arsenic atoms). The extension region 123 can be formed by an ion implantation process. It should be noted that, in the ion implantation process for forming the extension region 123, n-type dopants are also implanted in the N− region 128.

Next, in one embodiment, spacer regions 150 are formed on side walls of the gate dielectric region 130 and the gate electrode region 140. The spacer regions 150 can comprise silicon nitride. The spacer regions 150 can be formed by a conventional method.

Figure 1G:
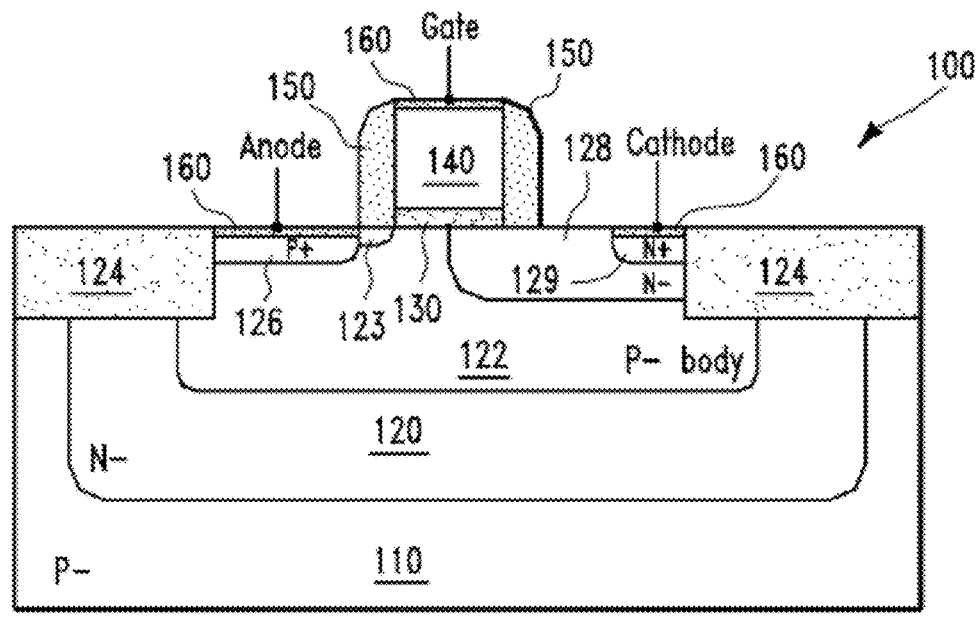

Next, with reference to FIG. 1G, in one embodiment, a P+ region 126, an N+ region 129, and silicide regions 160 are formed on the semiconductor structure 100 of FIG. 1F. The N+ region 129 can comprise silicon doped with n-type dopants (e.g., arsenic atoms), whereas the P+ region 126 can comprise silicon doped with p-type dopants (e.g., boron atoms). The N+ region 129 is heavily doped such that the dopant concentration of the N+ region 129 is higher than the dopant concentrations of the N− region 128 and the N− tub region 120. Similarly, the P+ region 126 is heavily doped such that the dopant concentration of the P+ region 126 is higher than the dopant concentrations of the P− substrate 110 and the P− body region 122. The P+ region 126, the N+ region 129, and the silicide regions 160 can be formed by a conventional method.

Next, in one embodiment, a dielectric layer (not shown) is formed on top of the structure 100 of FIG. 1G. Next, contact regions (not shown) are formed in the dielectric layer to provide electrical access to the silicide regions 160.

It should be noted that the P+ region 126, the P− body 122, the N− region 128, and the N+ region 129 constitute a P+/P−/N−/N+ graded diode structure 126+122+128+129. The P+ region 126 and the N+ region 129 serve as an anode 126 and a cathode 129, respectively, of the diode structure 126+122+128+129. The P+ region 126 and the P− body 122 constitute a graded doping concentration. The N+ region 129 and the N− region 128 constitute a graded doping concentration. As a result, if a voltage is applied to the anode 126 and the cathode 129 of the graded diode structure 126+122+128+129, then the applied voltage is spread out along the direction from the anode 126 to the cathode 129 of the diode structure 126+122+128+129 resulting in the diode structure 126+122+128+129 being able to withstand a breakdown voltage greater than that of a conventional diode structure.

In one embodiment, the diode structure 126+122+128+129 is used for electrostatic discharge (ESD) protection in a chip (not shown). More specifically, in one embodiment, the anode 126 and the cathode 129 of the diode structure 126+122+128+129 are electrically coupled to a first node and a second node of the chip, respectively, wherein the difference between a second voltage potential V2 of the second node and a first voltage potential V1 of the first node (i.e., V2−V1) tends to be positive and tends to increase during the operation of the chip.

In one embodiment, when the difference V2−V1 exceeds the breakdown voltage of the diode structure 126+122+128+129, there is a breakdown current flowing from the cathode 129 to the anode 126 through the diode structure 126+122+128+129 resulting in the difference V2−V1 being reduced (thereby protecting the chip from damages caused by electrostatic discharge).

In the embodiment above, the diode structure 126+122+128+129 operates in the reverse bias mode. In an alternative embodiment, the diode structure 126+122+128+129 can operate in the forward bias mode. More specifically, the anode 126 and the cathode 129 of the diode structure 126+122+128+129 can be electrically coupled to a third node and a fourth node of the chip, respectively, wherein the difference between a third voltage potential V3 of the third node and a fourth voltage potential V4 of the fourth node (i.e., V3−V4) tends to be positive and tends to increase during the operation of the chip.

In one embodiment, when the difference V3−V4 is positive, there is a forward bias current flowing from the anode 126 to the cathode 129 through the diode structure 126+122+128+129 resulting in the difference V3−V4 being reduced (thereby protecting the chip from damages caused by electrostatic discharge).

It should be noted that the diode structure 126+122+128+129 can also be used between a fifth node and a sixth node of the chip wherein the difference between a fifth voltage potential V5 of the fifth node and a sixth voltage potential V6 of the sixth node (i.e., V5−V6) can be negative or positive and can increase or decrease. When the difference V5−V6 is positive, there is a forward bias current flowing from the anode 126 to the cathode 129 through the diode structure 126+122+128+129 resulting in the difference V5−V6 being reduced. When the difference V6−V5 exceeds the breakdown voltage of the diode structure 126+122+128+129, there is a breakdown current flowing from the cathode 129 to the anode 126 through the diode structure 126+122+128+129 resulting in the difference V6−V5 being reduced.

In one embodiment, steps for forming the semiconductor structure 100 of FIG. 1G can be some or all steps for forming a conventional LDMOS (Lateral double-Diffused Metal Oxide Semiconductor) transistor (not shown) on the same P− substrate 110. For instance, the steps for forming a gate stack (not shown) of the LDMOS transistor are also the steps for forming the gate dielectric region 130, the gate electrode region 140, and the spacer regions 150 of the structure 100 of FIG. 1G.

In one embodiment, diode structures (not shown) similar to the structure 100 of FIG. 1G, LDMOS transistors (not shown), and standard/low-voltage CMOS devices (not shown) are all formed on the same wafer (not shown). Moreover, the diode structures can be used for ESD protection of both the LDMOS transistors and the standard/low-voltage CMOS devices in the manner described above.

It should be noted that the breakdown voltage of a standard/low-voltage CMOS device is usually 20V or lower. In one embodiment, the breakdown voltage of the diode structure 126+122+128+129 is higher than the breakdown voltage of a standard/low-voltage CMOS device (i.e., higher than 20V).

Figure 2:
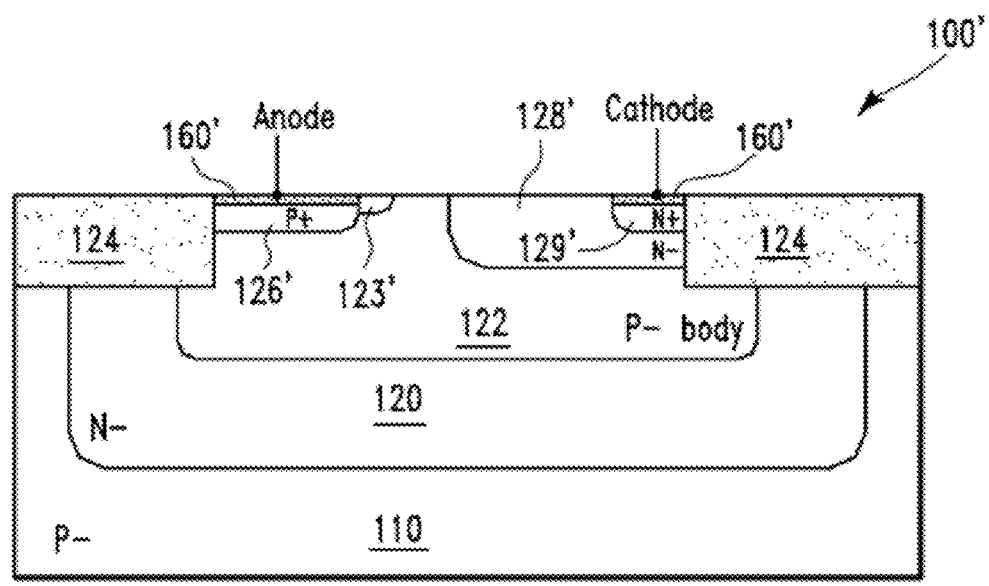
FIGS. 2 through 4 show cross-section views of second through fourth ESD semiconductor structures, in accordance with embodiments of the present invention.

FIG. 2 shows a cross-section view of an ESD semiconductor structure 100', in accordance with embodiments of the present invention. More specifically, the structure 100' of FIG. 2 is similar to the structure 100 of FIG. 1G except that the structure 100' does not have the gate dielectric region 130, the gate electrode region 140, and the spacer regions 150 of FIG. 1G. The semiconductor structure 100' can be formed by removing the gate dielectric region 130, the gate electrode region 140, and the spacer regions 150 of FIG. 1G. The removal of the gate dielectric region 130, the gate electrode region 140, and the spacer regions 150 of FIG. 1G can be performed by a conventional method.

It should be noted that a P+ region 126', a P− body 122, an N− region 128', and an N+ region 129' constitute a P+/P−/N−/N+ graded diode structure 126'+122+128'+129'. The P+ region 126' and the N+ region 129' serve as an anode 126' and a cathode 129', respectively, of the diode structure 126'+122+128'+129'. In one embodiment, the diode structure 126'+122+128'+129' is used for electrostatic discharge (ESD) protection in a chip in a manner similar to the manner in which the diode structure 126+122+128+129 of FIG. 1G.

Figure 3:
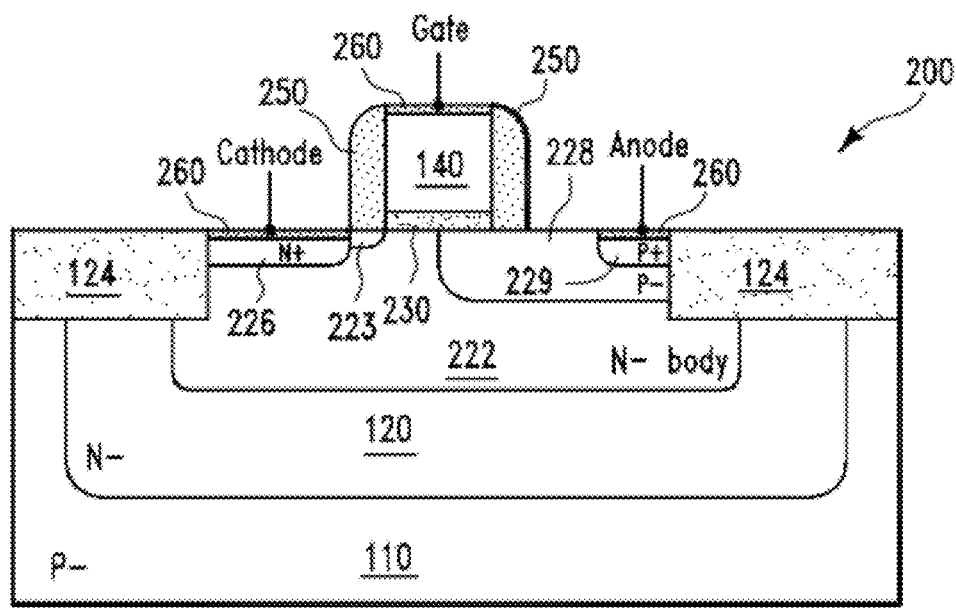
Figure 4:
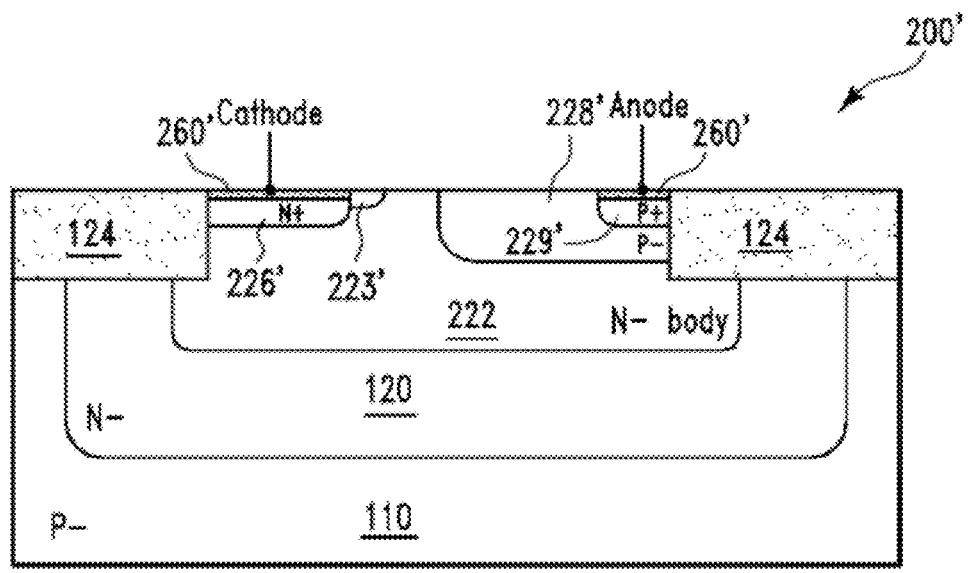

FIGS. 3 and 4 show cross-section views of ESD semiconductor structures 200 and 200', respectively, in accordance with embodiments of the present invention. The semiconductor structure 200 of FIG. 3 is similar to the semiconductor 100 of FIG. 1G except that (i) an N− body 222 and an N+ region 226 comprise n-type dopants and (ii) a P− region 228 and a P+ region 229 comprise p-type dopants. The formation of the structure 200 is similar to the formation of the structure 100 of FIG. 1G. The structure of the semiconductor structure 200' of FIG. 4 is similar to the structure of the semiconductor structure 200 of FIG. 3 except that the structure 200' does not have the gate dielectric region 230, the gate electrode region 240, and the spacer regions 250 of FIG. 5C.

It should be noted that a P+ region 229, a P– region 228, an N– body 222, and an N+ region 226 constitute a P+/P–/N–/N+ graded diode structure 229+228+222+226. The P+ region 229 and the N+ region 226 serve as an anode 229 and a cathode 226, respectively, of the diode structure 229+228+222+226. Similarly, the P+ region 229', the P– region 228', the N– body 222, and the N+ region 226' constitute a P+/P–/N–/N+ graded diode structure 229'+228'+222+226'. In one embodiment, the diode structures 229+228+222+226 and 229'+228'+222+226' are used for electrostatic discharge protection in a chip in a manner similar to the manner in which the diode structure 126+122+128+129 of FIG. 1G.

Figure 5A:
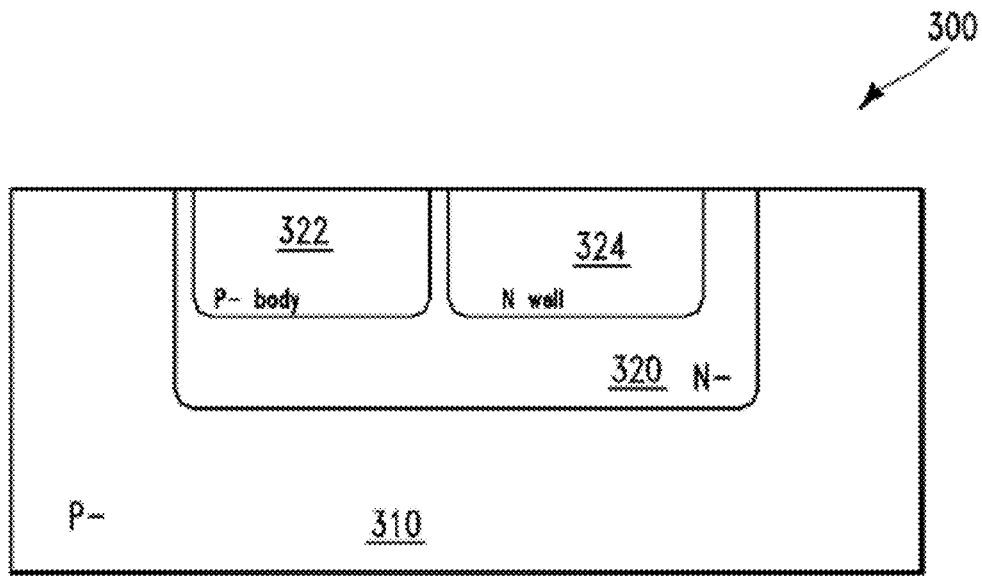
FIGS. 5A-5C show cross-section views used to illustrate a fabrication process of a fifth ESD semiconductor structure, in accordance with embodiments of the present invention.
Figure 5B:
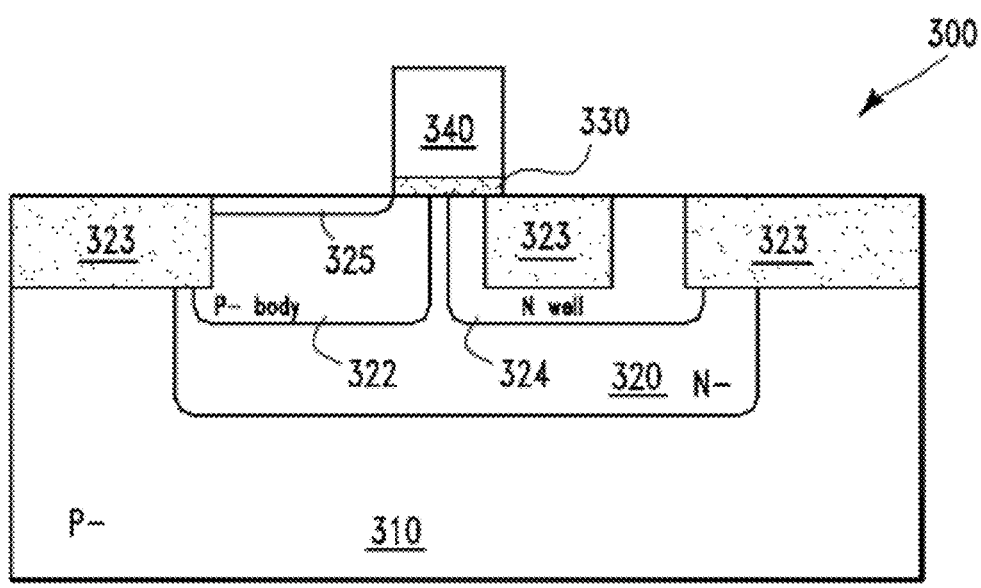
Figure 5C:
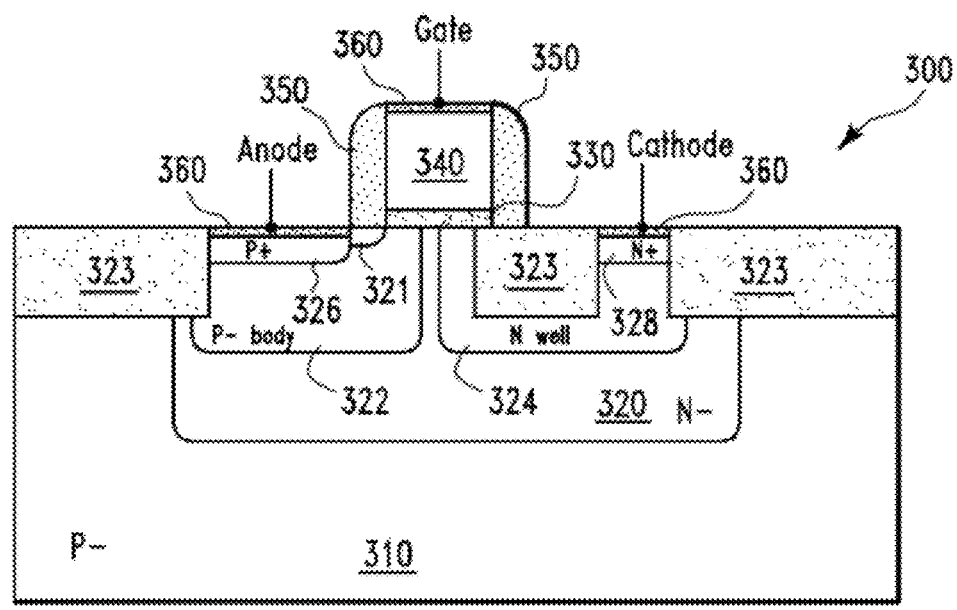

FIGS. 5A-5C show cross-section views used to illustrate a fabrication process of an ESD semiconductor structure 300, in accordance with embodiments of the present invention. More specifically, the fabrication process of the semiconductor structure 300 starts with the structure 300 of FIG. 5A. The structure 300 of FIG. 5A comprises a P– substrate 310, an N– region 320, a P– body region 322, and an N-well region 324. The structure 300 of FIG. 5A can be formed by lithographic and implanting processes.

Next, with reference to FIG. 5B, in one embodiment, STI regions 323 are formed in the structure 300 of FIG. 5A. The STI regions 323 can comprise silicon dioxide. The formation of the STI regions 323 in the structure 300 is similar to the formation of the STI regions 124 in the structure 100 of FIG. 1D.

Next, in one embodiment, a gate dielectric region 330 and a gate electrode region 340 are formed on top of the structure 300. The gate dielectric region 330 can comprise silicon dioxide. The gate electrode region 340 can comprise polysilicon. The gate dielectric region 330 and the gate electrode region 340 can be formed by a conventional method.

Next, in one embodiment, an extension region 325 is formed in the P– body region 322. The extension region 123 can comprise silicon doped with n-type dopants (e.g., arsenic atoms). The extension region 123 can be formed by an ion implantation process. It should be noted that, in the ion implantation process for forming the extension region 325, n-type dopants are also implanted in the N well region 324.

Next, with reference to FIG. 5C, in one embodiment, spacer regions 350 are formed on side walls of the gate dielectric region 330 and the gate electrode region 340. The spacer regions 350 can comprise silicon nitride. The spacer regions 350 can be formed by a conventional method.

Next, in one embodiment, a P+ region 326, an N+ region 328, and silicide regions 360 are formed on the structure 300. The P+ region 326, the N+ region 328, and the silicide regions 360 can be formed by a conventional method.

Next, in one embodiment, a dielectric layer (not shown) is formed on top of the structure 300 of FIG. 5C. Next, contact regions (not shown) are formed in the dielectric layer to provide electrical access to the silicide regions 360.

It should be noted that the P+ region 326, the P– body region 322, the N-region 320, the N-well region 324, and the N+ region 328 constitute a P+/P–/N–/N– well/N+ graded diode structure 326+322+320+324+328. The P+ region 326 and the N+ region 328 serve as an anode 326 and a cathode 328, respectively, of the diode structure 326+322+320+324+328. The P+ region 326 and the P– body 322 constitute a graded doping concentration. The N+ region 328, the N well region 324, and the N– region 320 constitute a graded doping concentration. As a result, if a voltage is applied to the anode 326 and the cathode 328 of the graded diode structure 326+322+320+324+328, then the applied voltage is distributed out along the direction from the anode 326 to the cathode 328 of the diode structure 326+322+320+324+328 resulting in the diode structure 326+322+320+324+328 being able to withstand a breakdown voltage greater than that of a conventional diode structure.

It should be noted that because of the STI region 323 in the N well region 324, the electrical path from the anode 326 to the cathode 328 of the diode structure 326+322+320+324+328 is longer than the case in which there is not the STI region 323 in the N well region 324. As a result, the diode structure 326+322+320+324+328 is able to withstand a higher breakdown voltage than the case in which there is not the STI region 323 in the N well region 324.

In one embodiment, the diode structure 326+322+320+324+328 is used for electrostatic discharging in a chip in a manner similar to the manner in which the diode structure 126+122+128+129 of FIG. 1G is used for electrostatic discharge protection.

Figure 6:
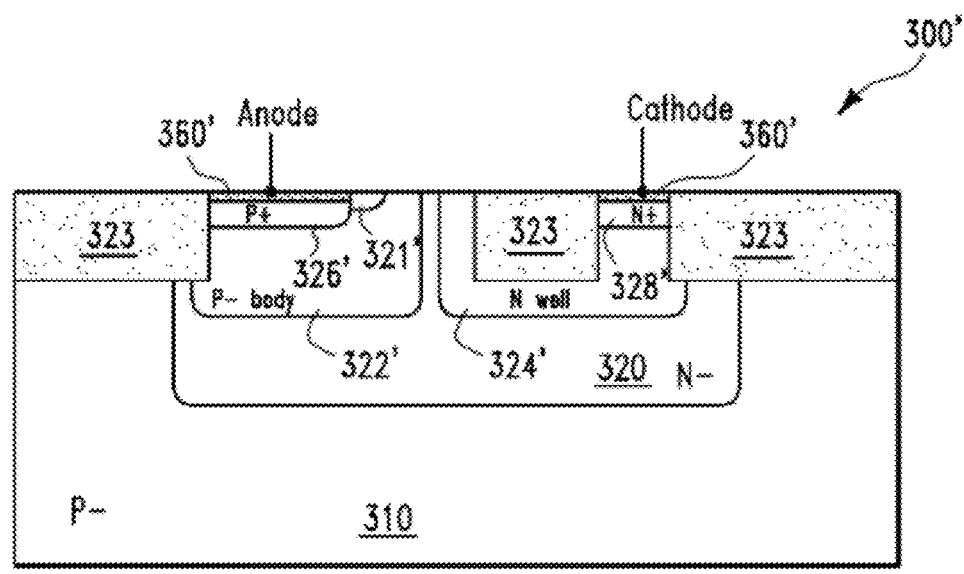
FIGS. 6 through 10 show cross-section views of sixth through tenth ESD semiconductor structures, in accordance with embodiments of the present invention.

FIG. 6 shows a cross-section view of an ESD semiconductor structure 300', in accordance with embodiments of the present invention. More specifically, the structure 300' of FIG. 6 is similar to the structure 300 of FIG. 5C except that the structure 300' does not have the gate dielectric region 330, the gate electrode region 340, and the spacer regions 350 of FIG. 5C. The semiconductor structure 300' can be formed by removing the gate dielectric region 330, the gate electrode region 340, and the spacer regions 350 of FIG. 5C. The removal of the gate dielectric region 330, the gate electrode region 340, and the spacer regions 350 of FIG. 5C can be performed by a conventional method.

It should be noted that a P+ region 326', a P– body 322', the N– region 320, an N well region 324', and an N+ region 328' constitute a P+/P–/N–/N well/N+ graded diode structure 326'+322'+320+324'+328'. The P+ region 326' and the N+ region 328' serve as an anode 326' and a cathode 328', respectively, of the diode structure 326'+322'+320+324'+328'. In one embodiment, the diode structure 326'+322'+320+324'+328' is used for electrostatic discharge (ESD) protection in a chip in a manner similar to the manner in which the diode structure 126+122+128+129 of FIG. 1G is used for electrostatic discharge (ESD) protection.

Figure 7:
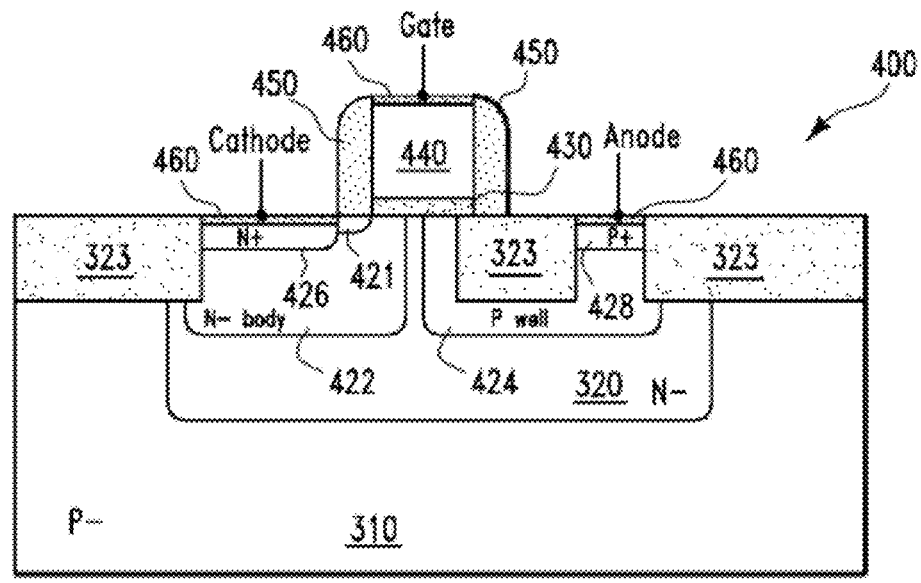
Figure 8:
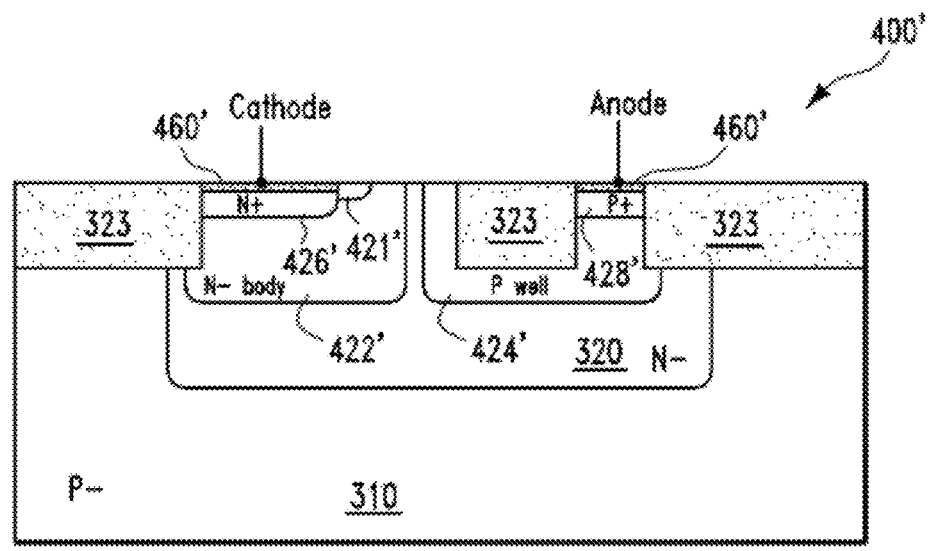

FIGS. 7 and 8 show cross-section views ESD semiconductor structures 400 and 400', respectively, in accordance with embodiments of the present invention. The structure of the semiconductor structure 400 of FIG. 7 is similar to the structure of the semiconductor 300 of FIG. 5C except that (i) an N– body 422 and an N+ region 426 comprise n-type dopants and (ii) a P well region 424 and a P+ region 428 comprise p-type dopants. The formation of the structure 400 is similar to the formation of the structure 300 of FIG. 5C. The structure of the semiconductor structure 400' of FIG. 8 is similar to the structure of the semiconductor structure 400 of FIG. 7 except that the structure 400' does not have the gate dielectric region 430, the gate electrode region 440, and the spacer regions 450 of FIG. 5C.

It should be noted that a P+ region 428, a P well region 424, the N– region 320, an N– body region 422, and an N+ region 426 constitute a P+/P well/N–/N–/N+ graded diode structure 428+424+320+422+426. The P+ region 428 and the N+ region 426 serve as an anode 428 and a cathode 426, respectively, of the diode structure 428+424+320+422+426. Similarly, a P+ region 428', a P well region 424', the N– region 320, an N– body region 422', and an N+ region 426' constitute a P+/P well/N–/N–/N+ graded diode structure 428'+424'+320+422'+426'. In one embodiment, the diode structures 428+424+320+422+426 and 428'+424'+320+422'+426' are used for electrostatic discharging in a chip in a manner similar to the manner in which the diode structure 126+122+128+129 of FIG. 1G is used for electrostatic discharge (ESD) protection.

Figure 9:
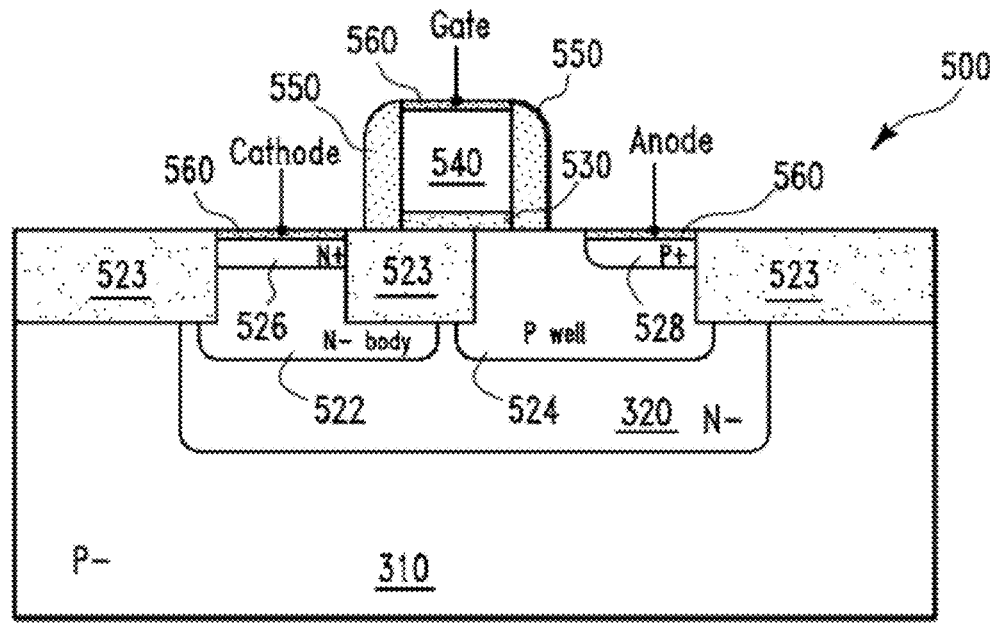
Figure 10:
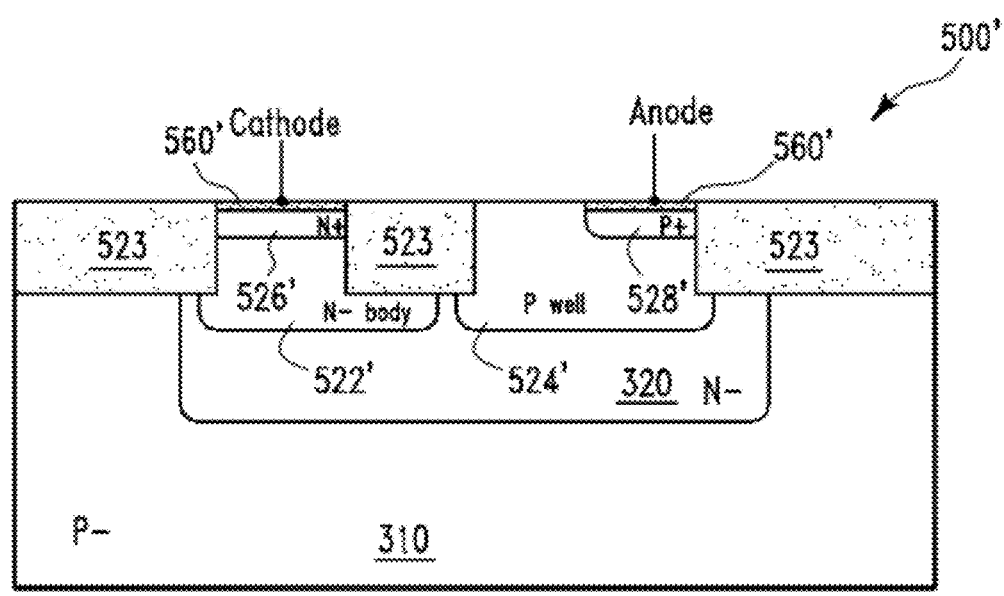

FIGS. 9 and 10 show cross-section views of ESD semiconductor structures 500 and 500', respectively, in accordance with embodiments of the present invention. The semiconductor structure 500 of FIG. 9 can be formed in a manner similar to the manner in which the semiconductor structure 400 of FIG. 7 is formed. The semiconductor structure 500' of FIG. 10 is similar to the semiconductor structure 500 of FIG. 9 except that the structure 500' does not have the gate dielectric region 530, the gate electrode region 540, and the spacer regions 550 of FIG. 9.

It should be noted that a P+ region 528, a P− well region 524, the N− region 320, an N− body region 522, and an N+ region 526 constitute a P+/P− well/N−/N−/N+ graded diode structure 528+524+320+522+526. The P+ region 528 and the N+ region 526 serve as an anode 528 and a cathode 526, respectively, of the diode structure 528+524+320+522+526. The STI region 523 is in both the N− body region 522 and the P well region 524. As a result, the electrical path from the anode 528 to the cathode 526 of the diode structure 528+524+320+522+526 is longer than the case in which there is not the STI region 523. As a result, the diode structure 528+524+320+522+526 is able to withstand a higher breakdown voltage than the case in which there is not the STI region 323. Similarly, a P+ region 528', a P− well region 524', the N− region 320, an N− body region 522', and an N+ region 526' constitute a P+/P− well/N−/N−/N+ graded diode structure 528'+524'+320+522'+526'. The P+ region 528' and the N+ region 526' serve as an anode 528' and a cathode 526', respectively, of the diode structure 528'+524'+320+522'+526'. In one embodiment, the diode structures 528+524+320+522+526 and 528'+524'+320+522'+526' are used for electrostatic discharging in a chip in a manner similar to the manner in which the diode structure 126+122+128+129 of FIG. 1G is used for electrostatic discharge (ESD) protection.

In summary, the graded diode structures of FIGS. 1G, 2-4, 5C, and 6-10 are used for electrostatic discharging in a chip. Because of graded doping concentrations of the p-type dopants regions and the n-type dopants regions, the graded diode structures can stand a breakdown voltage greater than that of a conventional diode structure.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure operation method, comprising:
    providing a semiconductor structure which includes a first doped semiconductor region, a second doped semiconductor region, a third doped semiconductor region, a fourth doped semiconductor region, and a fifth doped semiconductor region,
        wherein the second doped semiconductor region is in direct physical contact with the first and third doped semiconductor regions,
        wherein the fourth doped semiconductor region is in direct physical contact with the third and fifth doped semiconductor regions,
        wherein the first and second doped semiconductor regions are doped with a first doping polarity,
        wherein the third, fourth, and fifth doped semiconductor regions are doped with a second doping polarity which is opposite to the first doping polarity,
        wherein a first dopant concentration of the first doped semiconductor region is higher than a second dopant concentration of the second doped semiconductor region, and
        wherein a fifth dopant concentration of the fifth doped semiconductor region is higher than a fourth dopant concentration of the fourth doped semiconductor region;
    electrically coupling the first and fifth doped semiconductor regions to a first node and a second node of the provided semiconductor structure, respectively; and
    electrically charging the first node and the second node to a first electric potential and a second electric potential, respectively,
        wherein the first electric potential is different from the second electric potential.

2. The method of claim 1,
    wherein the first doping polarity is p-type,
    wherein the second doping polarity is n-type, and
    wherein the second electric potential of the second node is higher than the first electric potential of the first node.

3. The method of claim 2,
    wherein the first, second, third, fourth, and fifth doped semiconductor regions constitute a diode structure,
    wherein the first doped semiconductor region is an anode of the diode structure,
    wherein the fifth doped semiconductor region is a cathode of the diode structure,
    wherein the diode structure has a breakdown voltage, and
    wherein the second electric potential exceeds the first electric potential by at least the breakdown voltage.

4. The method of claim 3, further comprising, after said electrically charging the first and second nodes is performed, in response to a difference between the first electric potential of the first node and the second electric potential of the second node exceeding the breakdown voltage of the diode structure, sending a breakdown current from the second node to the first node through the diode structure resulting in the difference between the first electric potential and the second electric potential being reduced.

* * * * *